(12) United States Patent  
Sforzin (10) Patent No.: US 9,177,622 B2  
(45) Date of Patent: Nov. 3, 2015

(54) SUPPLY INDEPENDENT DELAYER

(71) Applicant: Micron Technology, Inc., Boise, ID (US)

(72) Inventor: Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/524,720

(22) Filed: Oct. 27, 2014

(65) Prior Publication Data

US 2015/0071012 A1 Mar. 12, 2015

Related U.S. Application Data

(63) Continuation of application No. 13/396,473, filed on Feb. 14, 2012, now Pat. No. 8,873,311.

(51) Int. Cl.
*G11C 5/14* (2006.01)
*G11C 7/22* (2006.01)
*G11C 7/10* (2006.01)
*H03H 11/26* (2006.01)

(52) U.S. Cl.
CPC ............... *G11C 7/222* (2013.01); *G11C 5/147* (2013.01); *G11C 7/1066* (2013.01); *G11C 7/1093* (2013.01); *H03H 11/26* (2013.01)

(58) Field of Classification Search
CPC ...... G11C 7/222; G11C 5/147; G11C 7/1066; G11C 7/1093; H03H 11/26
USPC ............. 365/189.09, 194; 327/276, 278, 284, 327/538
See application file for complete search history.

(56) References Cited

U.S. PATENT DOCUMENTS

| | | |
|---|---|---|
| 6,150,864 A | 11/2000 | Yach et al. |
| 6,262,616 B1 | 7/2001 | Srinivasan et al. |
| 6,928,128 B1 | 8/2005 | Sidiropoulos |
| 6,930,528 B2 | 8/2005 | Ajit |
| 7,095,264 B2 | 8/2006 | Jenkins et al. |
| 7,139,205 B1 | 11/2006 | Goldman et al. |
| 7,301,830 B2 * | 11/2007 | Takahashi et al. ............ 365/194 |
| 7,310,008 B1 * | 12/2007 | Masleid ........................ 326/121 |
| 7,359,240 B2 | 4/2008 | Lee et al. |
| 7,466,609 B2 | 12/2008 | Takahashi et al. |
| 7,557,631 B2 | 7/2009 | Sinha et al. |
| 8,027,195 B2 | 9/2011 | Li et al. |
| 8,873,311 B2 | 10/2014 | Sforzin |
| 8,970,275 B1 * | 3/2015 | Ren ................................ 327/261 |
| 2001/0045856 A1 * | 11/2001 | Ooishi ......................... 327/277 |
| 2008/0074203 A1 | 3/2008 | Yamanaka et al. |
| 2010/0259993 A1 | 10/2010 | Kang |
| 2010/0309735 A1 | 12/2010 | Hayashi |
| 2013/0208550 A1 | 8/2013 | Sforzin et al. |

OTHER PUBLICATIONS

Eitan, B., et al., "4-bit per cell NROM reliability", IEEE International Electron Devices Meeting, 2005. IEDM Technical Digest., (2005), 539-542.

* cited by examiner

*Primary Examiner* — Toan Le
(74) *Attorney, Agent, or Firm* — Schwegman Lundberg & Woessner, P.A.

(57) ABSTRACT

Electronic apparatus, systems, and methods can include a delayer having an inverter chain, where each inverter of the chain can be operatively regulated using current generators to control variation of the delay time of the delayer. In various embodiments, current generators can be arranged to provide reference voltages to each inverter stage of an inverter chain. Additional apparatus, systems, and methods are disclosed.

15 Claims, 11 Drawing Sheets

SUPPLY INDEPENDENT DELAYER

PRIORITY APPLICATION

This application is a continuation of U.S. application Ser. No. 13/396,473, filed Feb. 14, 2012, which is incorporated herein by reference in its entirety.

BACKGROUND

The semiconductor device industry has a market driven need to improve operation of electronic devices. Improvements to electronic devices may be addressed by improving the design of auxiliary structures that are used to facilitate the proper functioning of the electronic devices.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

High frequency design may include reducing the spread of performance of many functions in an integrated circuit. For example, if a high frequency digital signal of frequency 1/T is to be sampled by a clock line, the clock edge should arrive while the signal is stable, which typically means within a time interval smaller than T/2. In a variety of cases, to align signals with different paths it is possible to use a high frequency delayer that is stable with respect to the specifications for variations in the supply voltage. If the nominal delay of the delayer block is $T_d$ at the nominal supply voltage and the effective supply voltage moves within its specified range of values, the stability of the delayer with respect to the supply voltage helps ensure that the effective delay adheres to $T_d$.

Figure 1:
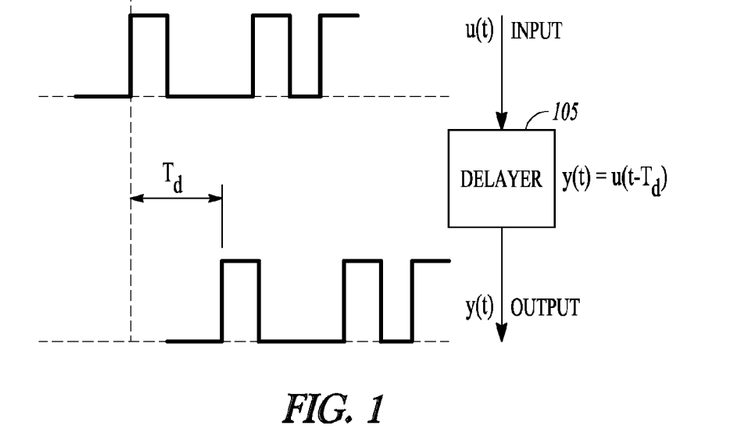
FIG. 1 depicts an example circuit that functions to provide a delay of a specified time interval to an input signal, in accordance with various embodiments.

FIG. 1 depicts an example embodiment of a circuit 105 that functions to provide a delay of a specified time interval to an input signal. The input signal may be a digital high frequency input signal. The delay provided can be substantially independent of the supply level variation. For example, with the relative variation in the supply voltage, $V_{CC}$, being 1, the relative variation in delay $T_d$ can be made smaller than ⅕. Thus, the relative variation of $T_d$ with respect to the supply voltage can be less than 20%. In various embodiments, small variations in the delay $T_d$ can be provided by applying appropriate mirroring factors between voltage reference generators and modules (or stages) of a delayer.

A delayer can be realized as a circuit that receives a signal and outputs a representation of the signal at a time that is shifted from the appearance of the input signal to the circuit. The representation of the signal provided to the delayer output can have the same waveform as the input signal. In some applications, the representation of the signal can be an inverted form of the received signal. In some applications, the representation of the signal can have the same waveform as the input signal but with variations in waveform characteristics, such as amplitude. A delayer may also be referred to as a delay unit by those of ordinary skill in the art, or by other appropriate terms.

The ideal delayer may be a complex system because it is not a finite dimension dynamical system. This means it may have an infinite number of state variables. In various embodiments, a lumped system made of a finite number of elements using metal-oxide-semiconductors (MOS) transistors, or their equivalents, can be used to approximate an ideal delayer apparatus. One of the limitations of this finite element approach is that there exists a maximum frequency beyond which the system is practically unusable.

Figure 2:
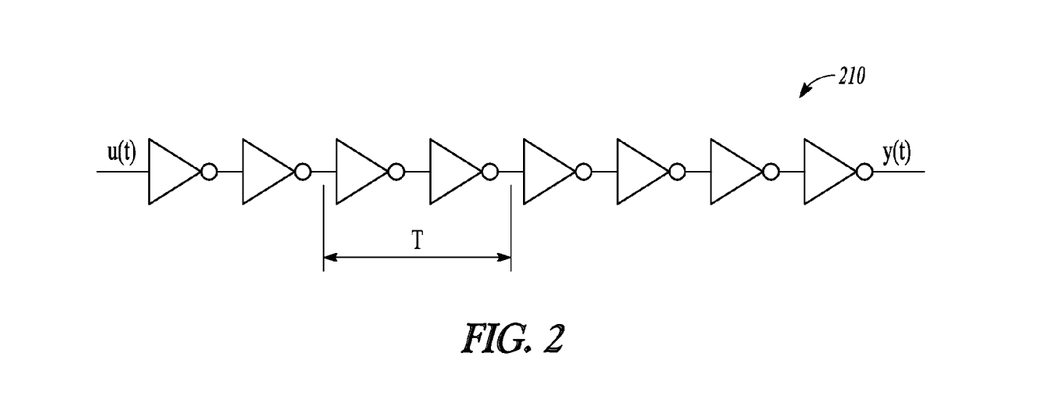
FIG. 2 shows an example inverter chain, which can be used as part of a delayer architecture, in accordance with various embodiments.

FIG. 2 shows an example inverter chain 210, which can be used as part of a delayer architecture in accordance with various embodiments. The inverter chain may use complimentary metal-oxide-semiconductors (CMOS) transistors. From FIG. 2, it can be understood that the maximum useable frequency reachable is approximately 1/T, where T is the time interval between two CMOS inverters. The inverter chain can be viewed as N inverters concatenated, with each inverter labeled by an integer according to its position in the inverter chain, beginning with the number 1. The signal output into the next inverter of the inverter chain from each inverter in an odd position is an inverted representation of the signal input to (and received by) the first inverter in the inverter chain.

Using a simplified quadratic law to model the saturation current of an MOS transistor, which can be used in the CMOS device:

$$I_d = \tfrac{1}{2}\mu C'_{ox}(W/L)(V_{gs}-V_{th})^2,$$

it can be understood that the inverter chain alone does not provide independence of variations in delay from the supply voltage, because of the dependency of the delay to the supply voltage. In this model for a given MOS transistor, $I_d$ is the drain current, $\mu$ is the charge-carrier mobility, $C'_{ox}$ is the gate oxide capacitance per unit area, W is the gate width, L is the gate length, $V_{gs}$ is the voltage between the gate and source, and $V_{th}$ is the threshold voltage. Neglecting drain diffusion capacitance of MOS transistors, the delay introduced by each single CMOS inverter can be expressed as:

$$T = (C_{out}V_{CC}/2)/I_d = [C'_{ox}(W_nL_n + W_pL_p)V_{CC}]/$$
$$[\mu_n C'_{ox}(W_n/L_n)(V_{CC} - V_{th,n})^2]$$
$$= kV_{CC}/(V_{CC} - V_{th,n})^2,$$

where $$k = [C'_{ox}(W_nL_n + W_pL_p)]/[\mu_n C'_{ox}(W_n/L_n)].$$

Figure 3:
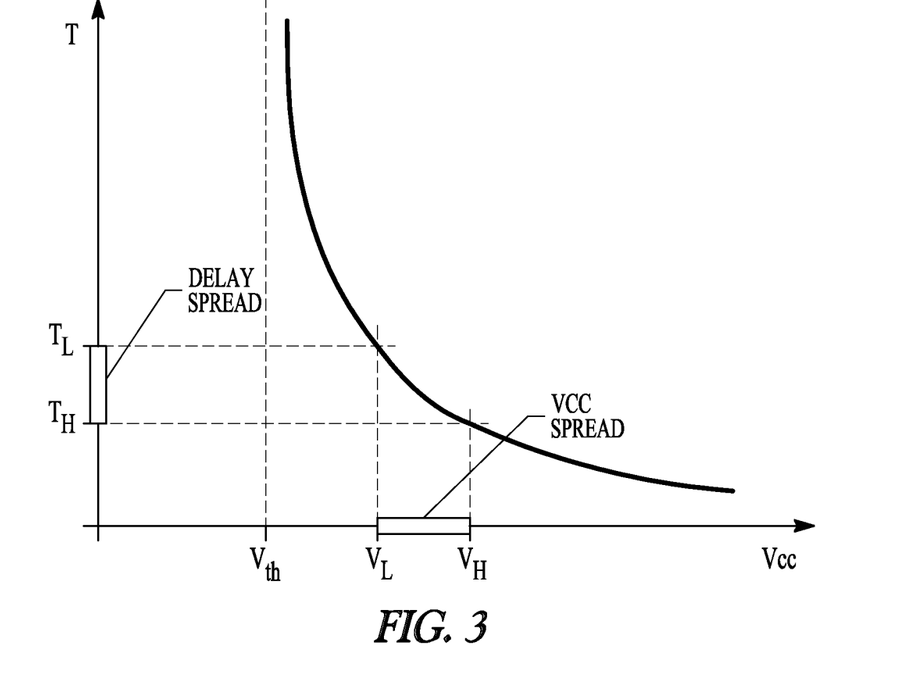
FIG. 3 shows the shape of a curve representing the delay introduced by a single inverter shown in FIG. 2, in accordance with various embodiments.

The capacitance $C_{out}$ is the output capacitance of the single CMOS inverter having a n-channel MOS (NMOS) transistor and p-channel MOS (PMOS) transistor. The threshold voltage $V_{th,n}$ is the threshold voltage of the NMOS transistor of the CMOS device. In this expression, n refers to the NMOS transistor of the CMOS device having electron mobility $\mu_n$, gate oxide capacitance per unit area $C'_{ox}$, gate width $W_n$, and gate length $L_n$. In this expression, p refers to the PMOS transistor of the CMOS device having hole mobility $\mu_p$, gate oxide capacitance per unit area $C'_{ox}$, gate width $W_p$, and gate length $L_p$. As can be seen, k is a parameter that is directly related to the structure of the MOS transistors. FIG. 3 shows the shape of the curve $T=f(V_{CC})$ of the above expression.

From FIG. 3, it is apparent that for a higher supply voltage, the delay time is lower. For a spread in the supply voltage from a lower value $V_L$ to a higher value $V_H$, the corresponding spread in the delay time is from a higher value $T_L$, corresponding to $V_L$, to a lower value $T_H$, corresponding to $V_H$. The delay spread can be evaluated by simulation observing that it is greater than the spread of supply voltage in relative terms, that is:

$$T_{spread}/T > V_{CCspread}/V_{CC}$$

Starting from the functional relationship that is illustrated in FIG. 3, to decrease the spread of the delay, that is, to make the delays correspondent to the extreme values of supply voltage have values closer to each other, one can proceed to reduce the current of the MOS to charge/discharge the output capacitance of the single inverter for high supply voltage. Rather than using a current that increases with the second power of $V_{CC}$ to charge the output capacitance, a constant current can be used.

Figure 4:
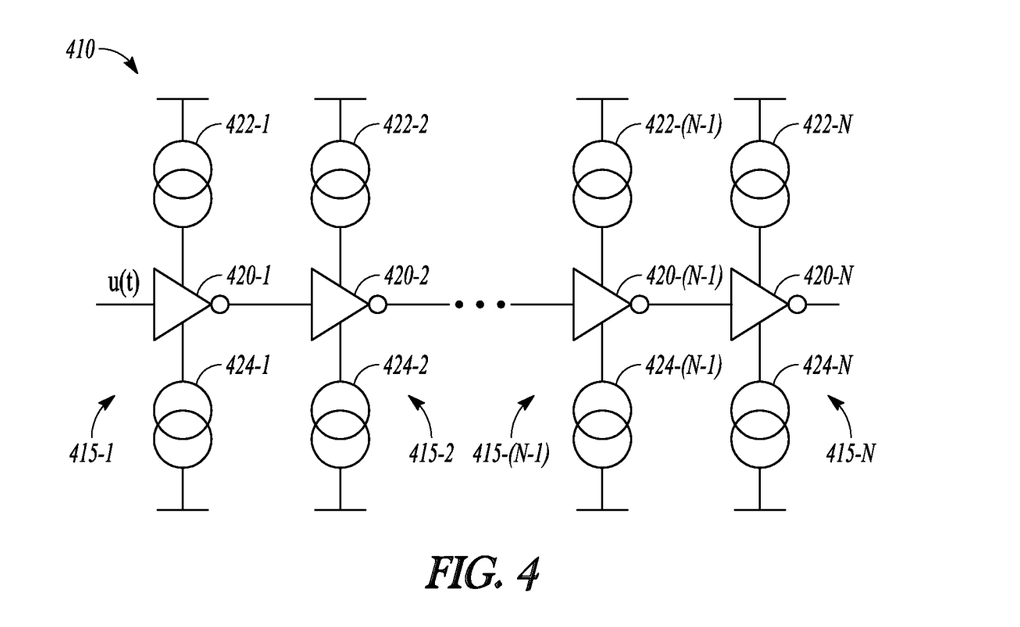
FIG. 4 shows an example inverter chain having a number of inverter stages, in accordance with various embodiments.

FIG. 4 shows an example inverter chain 410 with constant current used to charge the output capacitance of each inverter in inverter chain 410. Inverter chain 410 can have a number of inverter stages 415-1, 415-2 . . . 415-(N-1), 415-N, where each inverter stage 415-I, for each I ranging from 1 to N, includes a respective inverter 420-I coupled with respective constant current sources 422-I and 424-I. Each current source 422-I can couple its respective inverter 420-I to supply voltage $V_{CC}$ at a supply voltage node. Each current source 424-I can couple its respective inverter 420-I to reference supply voltage $V_{SS}$ at a reference supply voltage node. $V_{SS}$ may be referenced to zero volts or ground. With each inverter 420-I being a CMOS device, the PMOS and the NMOS of the CMOS inverter are used only as switches that enable the correspondent current generator to inject (or to draw) current in (from) the output.

Simulation provides a vehicle to demonstrate that an architecture using only constant current with an inverter chain is not enough to provide small variations in the delay time in the interval [$V_{CC\_LOW}$, $V_{CC\_HIGH}$]. With respect to the functional relationship illustrated in FIG. 3, reduced variations in delay time are manifested by the curve approaching a horizontal line locally in the interval [$V_{CC\_LOW}$, $V_{CC\_HIGH}$]. An approach leading to reduced variations in the delay time of a single inverter can include reversing the dependence: for higher supply voltage, the current used is lower to drive the output node of the single inverter.

Figure 5:
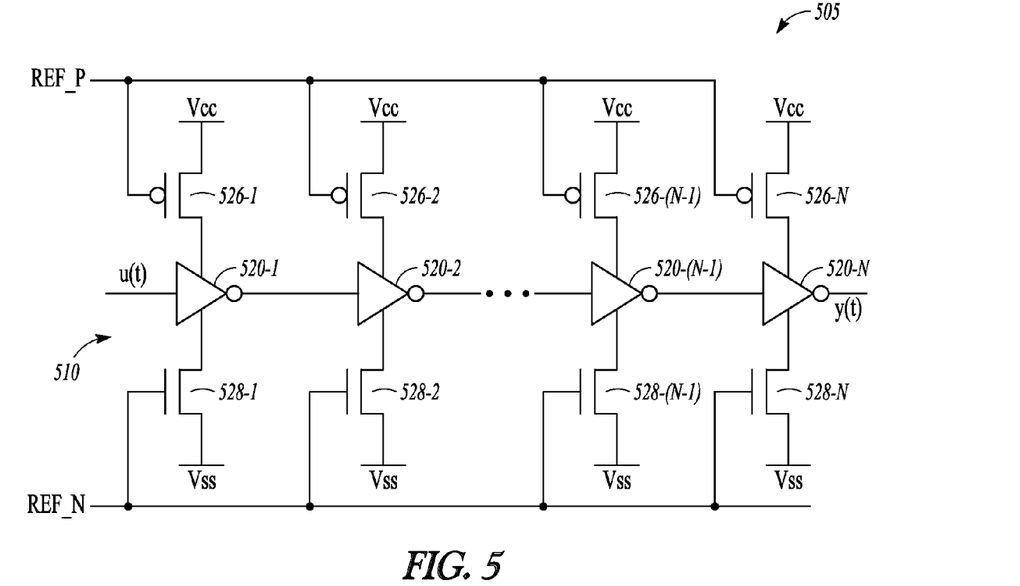
FIG. 5 shows an example of a delayer including an inverter chain regulated by reference voltages to output a signal as a delayed representation of an input signal, in accordance with various embodiments.

FIG. 5 shows an example embodiment of a delayer 505 including an inverter chain 510 regulated by reference voltages to output y(t) as a delayed representation of input u (t). Delayer 505 can include inverter chain 510 having a number of inverters 520-1, 520-2 . . . 520-(N-1), 520-N; a number of transistors 526-1, 526-2 . . . 526-(N-1), 526-N; and a number of transistors 528-1, 528-2 . . . 528-(N-1), 528-N. Each of transistors 526-1, 526-2 . . . 526-(N-1), 526-N couples its respective inverter 520-1, 520-2 . . . 520-(N-1), 520-N to $V_{CC}$ at a supply voltage node. Since these transistors couple their respective inverters up to supply voltage $V_{CC}$ at a supply voltage node, these transistors are herein referred to as pull-up transistors 526-1, 526-2 . . . 526-(N-1), 526-N. Each of transistors 528-1, 528-2 . . . 528-(N-1), 528-N couples its respective inverter 520-1, 520-2 . . . 520-(N-1), 520-N to $V_{SS}$ at a reference supply voltage node. $V_{SS}$ may be referenced to zero volts or ground. Since these transistors couple their respective inverters down to reference supply voltage $V_{SS}$ at a reference supply voltage node, these transistors are herein referred to as pull-down transistors 528-1, 528-2 . . . 528-(N-1), 528-N. The gate of each of pull-up transistor 526-1, 526-2 . . . 526-(N-1), 526-N is coupled to a first reference to receive a first reference voltage. The gate of each of pull-down transistor 528-1, 528-2 . . . 528-(N-1), 528-N is coupled to a second reference to receive a second reference voltage. With each of pull-up transistors 526-1, 526-2 . . . 526-(N-1), 526-N structured as a PMOS transistor, the first reference can be referred to as REF_P. With each of pull-down transistors 528-1, 528-2 . . . 528-(N-1), 528-N structured as a NMOS transistor, the second reference can be referred to as REF_N. Each of inverters 520-1, 520-2 . . . 520-(N-1), 520-N can be structured as a CMOS inverter. For each positive integer I ranging from 1 to N, inverter 520-I, transistor 526-I, and transistor 528-I together can be referred to as an inverter stage of inverter chain 510.

Figure 6A:
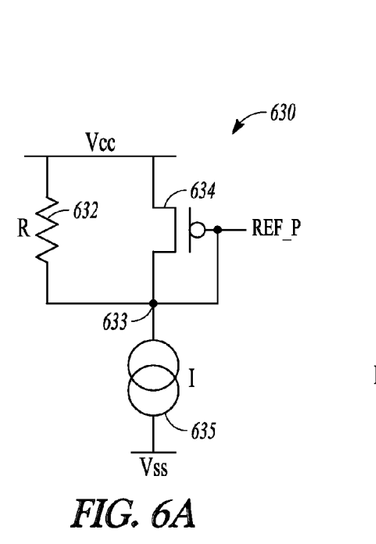
FIGS. 6A and 6B show example embodiments of circuits to generate the reference voltages used by the delayer of FIG. 5, in accordance with various embodiments.
Figure 6B:
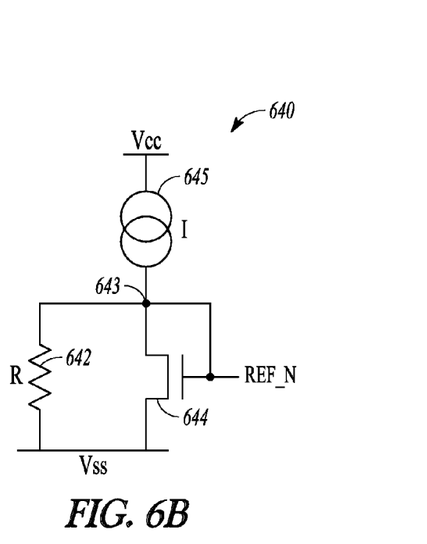

FIGS. 6A and 6B show example embodiments of circuits 630 and 640 to generate the reference voltages used by delayer 505 of FIG. 5. Circuit 630 includes a current generator 635, a resistance unit 632, and a transistor 644 to generate REF_P. Current generator 635 is coupled directly to reference supply voltage, $V_{SS}$, at a reference supply voltage node and current generator 635 is coupled to supply voltage, $V_{CC}$, at a supply voltage node by resistance unit 632 in parallel with transistor 634. Transistor 634 can be structured as a p-channel transistor with its source coupled to $V_{CC}$ at a supply voltage node and its drain coupled to its gate and resistance unit 632 at node 633. REF_P is effectively provided from node 633.

Circuit 640 includes a current generator 645, a resistance unit 642, and a transistor 644 to generate REF_N. Current generator 645 is coupled directly to supply voltage, $V_{CC}$, at a supply voltage node and current generator 635 is coupled to reference supply voltage, $V_{SS}$, at a reference supply voltage node by resistance unit 642 in parallel with transistor 644. Transistor 644 can be structured as a n-channel transistor with its source coupled to $V_{SS}$ at a reference supply voltage node and its drain coupled to its gate and resistance unit 642 at node 643. REF_N is effectively provided from node 643.

Each inverter 520-1, 520-2 ... 520-(N-1), 520-N of delayer 505 of FIG. 5 can be operatively regulated by first current generator 635 and second current generator 645 to control variation of the delay time. First current generator 635 and second current generator 645 can be structured such that, for a variation of a supply voltage $V_{CC}$ to delayer 505, variation of the delay time is less than or equal to a variation amount based on first current generator 635 and second current generator 645. The variation amount may be set to a desired percentage of the delay time and may be based on outputs from first current generator 635 and second current generator 645. As seen in FIGS. 6A and 6B, not all of the entire current I of each current generator 635 and 645 flows to its respective MOS transistor for mirroring. A part of the current I flows through resistance units 635 and 645, respectively. A resistance of resistance unit 635 can be approximately equal to a resistance of resistance unit 645. Resistance units 635 and 645 can be formed as standard resistors or as other devices or circuits that effectively function as a resistor. Resistance units 635 and 645 can be arranged as resistors such that the resistance of the first resistance unit equals the resistance of the second resistance unit. By calibrating R to a selected resistance, it is possible to match the delay $T_d$ to desired spread in $T_d$ for the application circuit to which the delayer is applied.

Figure 7:
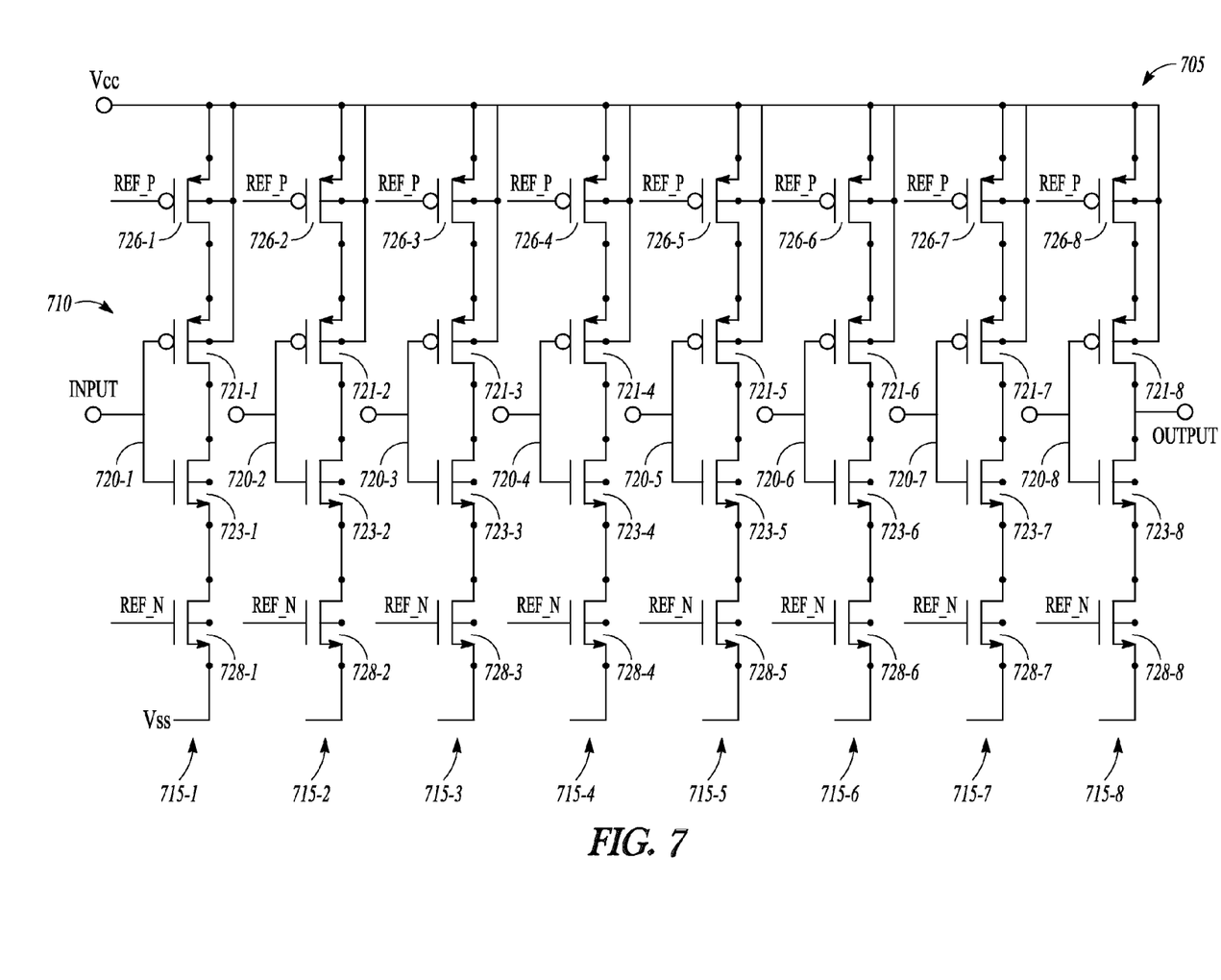
FIG. 7 shows an example delayer including an inverter chain regulated by reference voltages to provide a signal at an output of the delayer as a delayed representation of a signal received at an input of the delayer, in accordance with various embodiments.

FIG. 7 shows an example embodiment of a delayer 705 including an inverter chain 710 regulated by reference voltages to provide a signal at an output as a delayed representation of a signal received at an input. Delayer 705 includes inverter chain 710 having 8 inverter stages 715-1 ... 715-8 in this example embodiment. The number of inverter stages for a delayer having the architecture shown in FIG. 7 can be more or less than 8 stages. Inverter stages 715-1 ... 715-8 include inverters 720-1 ... 720-8, respectively. Inverters 720-1 ... 720-8 include PMOS transistors 721-1 ... 721-8, respectively, and NMOS transistors 723-1 ... 723-8. Each of inverters 720-1 ... 720-8 can be structured as CMOS inverters.

Each of pull-up transistors 726-1 ... 726-8 couples its respective inverter 520-1 ... 520-8 to $V_{CC}$. Each of pull-up transistors 726-1 ... 528 can be structured as a PMOS transistor with its gate arranged to receive reference voltage REF_P. Each of pull-down transistors 728-1 ... 728-8 couples its respective inverter 720-1 ... 720-8 to $V_{SS}$. $V_{SS}$ may be referenced to zero volts or ground. Each of pull-down transistors 728-1 ... 728-8 can be structured as a NMOS transistor with its gate arranged to receive reference voltage REF_N.

Figure 8:
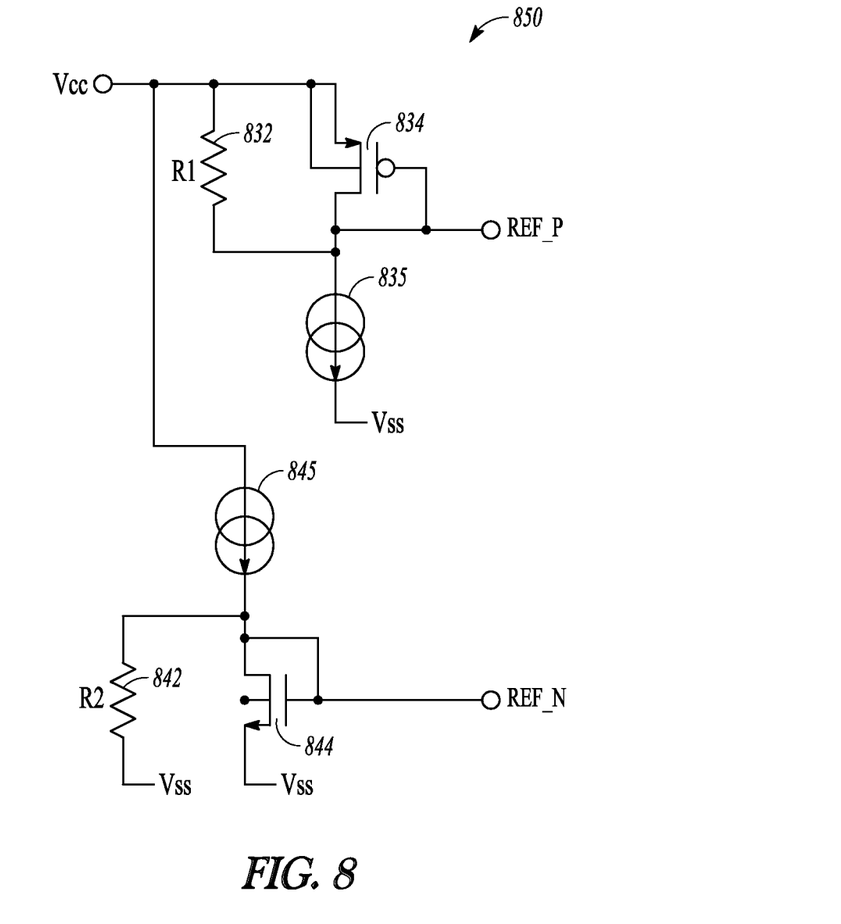
FIG. 8 shows an example circuit to generate reference voltages for the delayer of FIG. 7, in accordance with various embodiments.

FIG. 8 shows an example embodiment of a circuit 850 to generate reference voltages for delayer 705 of FIG. 7. Circuit 850 includes a current generator 835, a first resistor 832, and a transistor 834 to generate REF_P and a current generator 845, a second resistor 842, and a transistor 844 to generate REF_N. Current generator 835 is coupled directly to reference supply voltage, $V_{SS}$, at a reference supply voltage node and current generator 835 is coupled to supply voltage, $V_{CC}$, at a supply voltage node by resistor 832 in parallel with transistor 834. Transistor 834 can be structured as a p-channel transistor with its source coupled to $V_{CC}$ at a supply voltage node and its drain coupled to its gate and resistor 832 to provide REF_P. Current generator 845 is coupled directly to supply voltage, $V_{CC}$, at a supply voltage node and current generator 835 is coupled to reference supply voltage, $V_{SS}$, at a reference supply voltage node by resistor 842 in parallel with transistor 844. Transistor 844 can be structured as a n-channel transistor with its source coupled to $V_{SS}$ at a reference supply voltage node and its drain coupled to its gate and resistor 842 to provide REF_N. Resistor 832 and resistor 842 can be structured to have the same resistance value.

Delayer 705 and circuit 850 can be formed to provide a delay of a specified amount over a frequency range. Pull-up transistors 726-1 ... 726-8 can be formed to be substantially identical with a width to length (W/L) characteristic of approximately 9.0 μm/0.18 μm or approximately 9.0 μm/0.2 μm. Pull-down transistors 728-1 ... 728-8 can be formed to be substantially identical with a W/L characteristic of approximately 3.0 μm/0.18 μm or approximately 3.0 μm/0.2 μm. PMOS transistors 721-1 ... 721-8 can be formed to be substantially identical with a W/L characteristic of approximately 3.0 μm/0.18 μm or approximately 3.0 μm/0.2 μm. NMOS transistors 723-1 ... 723-8 can be formed to be substantially identical with a W/L characteristic of approximately 1.0 μm/0.18 μm or approximately 1.0 μm/0.2 μm. In addition, transistors 834 and 844 of circuit 850 can be formed with W/L characteristics of approximately 9.0 μm/16.0 μm and approximately 3.0 μm/16.0 μm, respectively. With resistor 832 and resistor 842 each having a resistance value of about 200 kΩ and current generator 835 and current generator 845 each providing a constant current of about 10.0 μA, delayer 705 can operate to realize a delay of about 1.6 ns for digital signals up to about 5 GHz. For delayer 705 formed with transistors of different characteristics and circuit 850 with transistors, resistors, and current sources of different characteristics, delay times of other than about 1.6 ns can be achieved.

Current generator 835 and current generator 845 in FIG. 8 can be built by using a reference source disposed in an integrated circuit chip to which the representation of the signal delayed by the delay time is operatively transmitted from the output of delayer 705. The reference source can be a substantially constant reference source. For example, in memory applications, a reference voltage IREF typically present in memory devices can be used, where IREF is the voltage, generated by a dedicated circuit, that allows a NMOS transistor (W/L≈2 μm/2 μm), for instance, to drive a 10 uA current.

Figure 9:
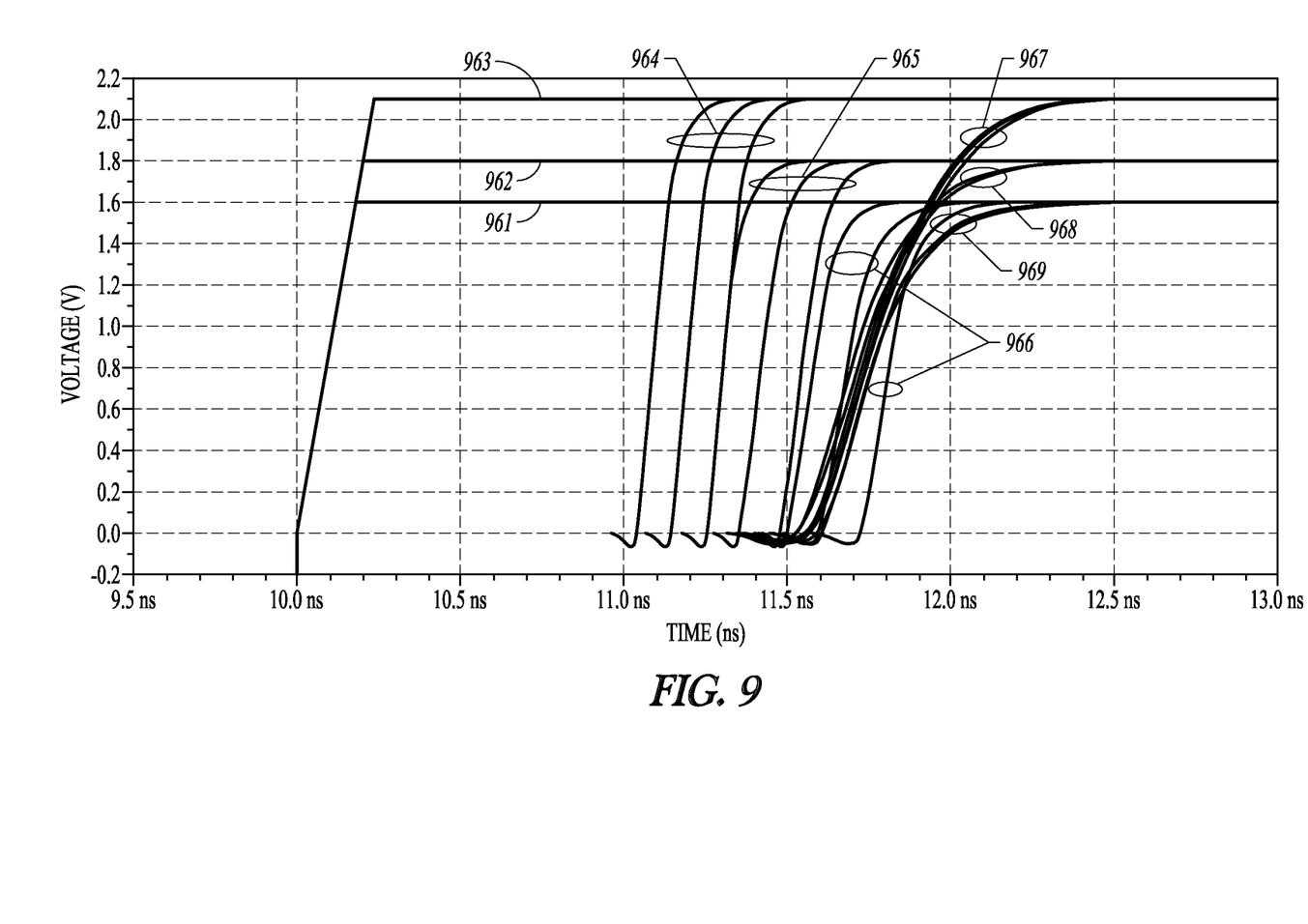
FIG. 9 shows simulation results of an example delayer regulated by reference voltages compared to a delayer having only an inverter chain as shown in FIG. 2, in accordance with various embodiments.

FIG. 9 shows simulation results of an embodiment of a delayer regulated by reference voltages compared to a delayer having only an inverter chain as shown in FIG. 2. Curves 961, 962, and 963 show input signals for the different example supply voltages 1.6V, 1.8V, and 2.1V, respectively. A set 964 of curves is shown as outputs of an inverter only chain with a supply voltage of 2.1 V at three temperature values (−40 C, 25 C, 120 C). A set 965 of curves is shown as outputs of an inverter only chain with a supply voltage of 1.8 V at three temperature values (−40 C, 25 C, 120 C). A set 966 of curves is shown as outputs of an inverter only chain with a supply voltage of 1.6 V at three temperature values (−40 C, 25 C, 120 C). A set 967 of curves is shown as outputs of a delayer regulated by reference voltages with a supply voltage of 2.1 V at three temperature values (−40 C, 25 C, 120 C). A set 968 of curves is shown as outputs of a delayer regulated by reference voltages with a supply voltage of 1.8 V at three temperature values (−40 C, 25 C, 120 C). A set 969 of curves is shown as outputs of a delayer regulated by reference voltages with a supply voltage of 1.6 V at three temperature values (−40 C, 25 C, 120 C). The spread of the sets 967, 968, and 969 for the delayer regulated by reference voltages is about 5% of the delay time realized in the nominal condition of supply voltage and temperature, while the spread of the sets 964, 965, and 966 for the inverter only delay architecture is about 55% of the delay time realized in the nominal condition of supply voltage and temperature.

Figure 10:
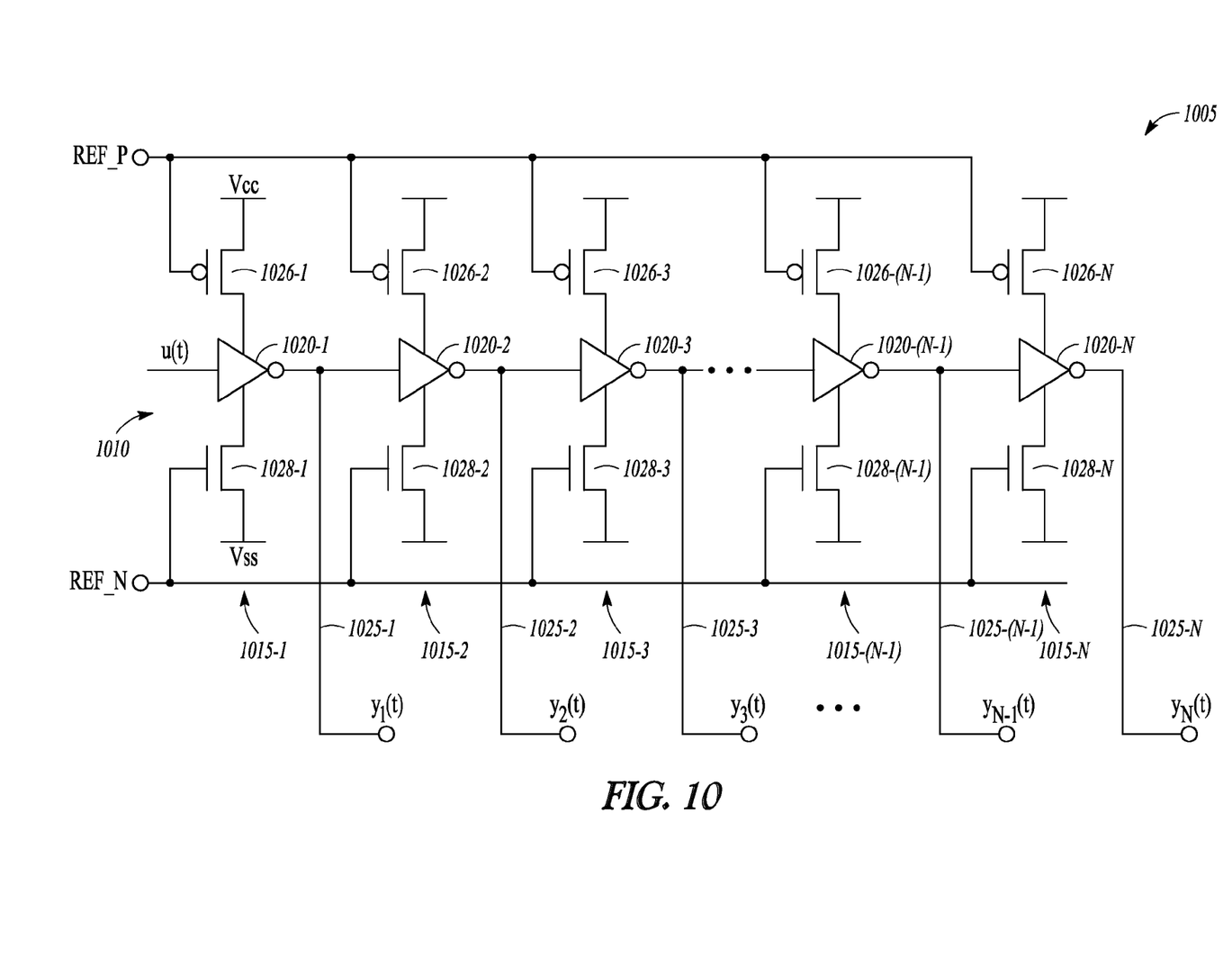
FIG. 10 illustrates an example delayer that provides a selectable delay for a signal input to the delayer, in accordance with various embodiments.

FIG. 10 illustrates an example embodiment of a delayer 1005 that provides a selectable delay for a signal input to delayer 1005. Delayer 1005 can be arranged similar to or identical to delayers regulated by reference voltages such as delayers discussed with respect to FIGS. 5-8 with additional features. These features can include output lines 1025-1 . . . 1025-(N-1) that tap the output of each inverter stage 1015-1 . . . 1015-(N-1) of an inverter chain 1010 of delayer 1005 in addition to the output line 1025-N of inverter stage 1015-N at the end of inverter chain 1010.

Inverter stage 1015-1 . . . 1015-(N-1) can include inverters 1020-1, 1020-2 . . . 1020-(N-1), 1020-N, respectively; pull-up transistors 1026-1, 1026-2 . . . 1026-(N-1), 1026-N, respectively; and pull-down transistors 1028-1, 1028-2 . . . 1028-(N-1), 1028-N, respectively. Each of transistors 1026-1, 1026-2 . . . 1026-(N-1), 1026-N couples its respective inverter 1020-1, 1020-2 . . . 1020-(N-1), 1020-N to $V_{CC}$. Each of transistors 1028-1, 1028-2 . . . 1028-(N-1), 1028-N couples its respective inverter 1020-1, 1020-2 . . . 1020-(N-1), 1020-N to $V_{SS}$. $V_{SS}$ may be referenced to zero volts or ground. The gate of each of pull-up transistors 1026-1, 1026-2 . . . 1026-(N-1), 1026-N is coupled to a first reference, REF_P. The gate of each of pull-down transistors 1028-1, 1028-2 . . . 1028-(N-1), 1028-N is coupled to a second reference, REF_N. Each of inverter stage inverters 1020-1, 1020-2 . . . 1020-(N-1), 1020-N can be structured as a CMOS inverter. References REF_P and REF_N can be provided by circuits based on current generators similar to or identical to the circuits illustrated in FIGS. 6A-B and 8.

Output lines that tap off the output of inverters disposed in the odd numbered positions of inverter chain 1010 (numbered by sequential non-zero positive integers) provide representations of the input signal, u(t), that are inverted versions of the input signal. Inverted versions of a signal can also be provided from delayer 1005 by first inverting the signal and then applying the signal to delayer 1005. Therefore, delayer 1005 can be structured with output lines that tap only the inverters at even numbered positions in inverter chain 1010. Further, delayer 1005 can be structured with a selected number of output lines from selected inverters such that the number of output lines is different from 1, N, or N/2.

Delayer 1005 can be structured such that each output signal $y_1(t) \ldots y_N(t)$ is connected to different circuits on an integrated circuit chip. In those architectures in which outputs of only selected inverters are tapped, only selected ones of output signals $y_1(t) \ldots y_N(t)$ are connected to different circuits. Delayer 1005 can be fabricated with all of output lines 1025-1 . . . 1025-(N-1), 1025-N formed in place, with only selected ones of the output lines 1025-1 . . . 1025-(N-1), 1025-N connected to one or more circuits to provide the representation of the input signal delayed by a selected amount of time to the one or more circuits. The non-selected output lines may remain unconnected. In another alternative architecture, delayer 1005 can be fabricated with selected ones of output lines 1025-1 . . . 1025-(N-1), 1025-N formed in place, with only selected ones of the formed selected output lines connected to one or more circuits to provide the representation of the input signal delayed by a selected amount to the one or more circuits. The non-selected output lines may remain unconnected.

Figure 11:
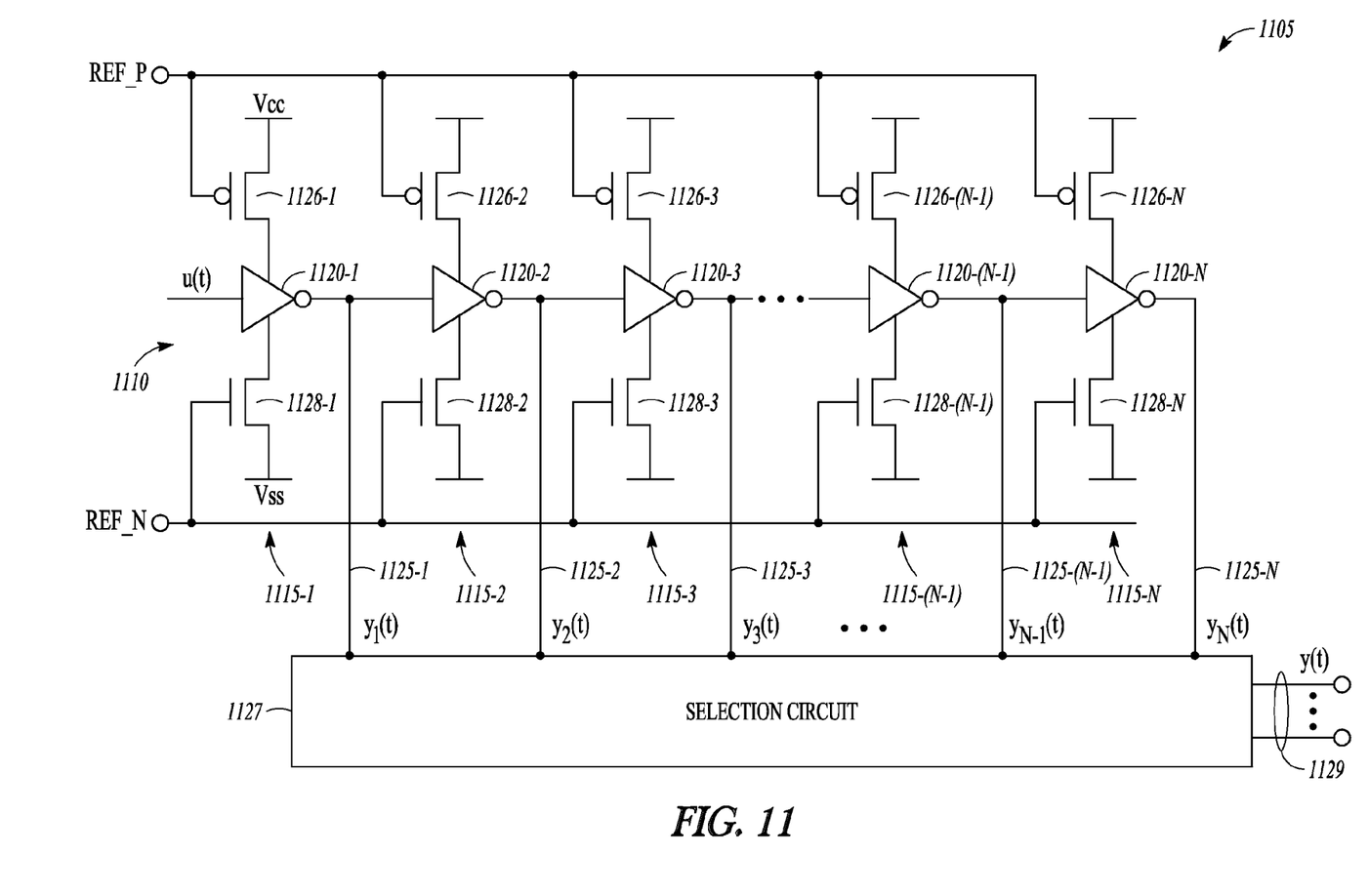
FIG. 11 illustrates an example delayer that provides an operatively selectable delay for a signal input to delayer, in accordance with various embodiments.

FIG. 11 illustrates an example embodiment of a delayer 1105 that provides an operatively selectable delay for a signal input to delayer 1105. Delayer 1105 can be arranged similar to or identical to delayers regulated by reference voltages such as delayers discussed with respect to FIG. 10 with additional features. These features can include a selection circuit 1127 coupled to output lines 1125-1 . . . 1125-N that tap the output of each inverter stage 1115-1 . . . 1115-N of an inverter chain 1110 of delayer 1105.

Inverter stage 1115-1 . . . 1115-(N-1) can include inverters 1120-1, 1120-2 . . . 1120-(N-1), 1120-N, respectively; pull-up transistors 1126-1, 1126-2 . . . 1126-(N-1), 1126-N, respectively; and pull-down transistors 1128-1, 1128-2 . . . 1128-(N-1), 1128-N, respectively. Each of transistors 1126-1, 1126-2 . . . 1126-(N-1), 1126-N couples its respective inverter 1120-1, 1120-2 . . . 1120-(N-1), 1120-N to $V_{CC}$. Each of transistors 1128-1, 1128-2 . . . 1128-(N-1), 1128-N couples its respective inverter 1120-1, 1120-2 . . . 1120-(N-1), 1120-N to $V_{SS}$. $V_{SS}$ may be referenced to zero volts or ground. The gate of each of pull-up transistors 1126-1, 1126-2 . . . 1126-(N-1), 1126-N is coupled to a first reference, REF_P. The gate of each of pull-down transistors 1128-1, 1128-2 . . . 1128-(N-1), 1128-N is coupled to a second reference, REF_N. Each of inverter stage inverters 1120-1, 1120-2 . . . 1120-(N-1), 1120-N can be structured as a CMOS inverter. References REF_P and REF_N can be provided by circuits based on current generators similar to or identical to the circuits illustrated in FIGS. 6A-B and 8.

Output lines that tap off of the output of inverters disposed in the odd numbered positions of inverter chain 1110 (numbered by sequential non-zero positive integers) provide representations of the input signal, u(t), that are inverted versions of the input signal. Inverted versions of a signal can also be provided from delayer 1105 by first inverting the signal and then applying the signal to delayer 1105. Therefore, delayer can be structured with output lines that tap only the inverters at even numbered positions in inverter chain 1110. Further, delayer 1105 can be structured with a selected number of output lines from selected inverters such that the number of output lines is different from 1, N, or N/2.

Delayer 1105 can be structured such that each output signal $y_1(t) \ldots y_N(t)$ is to be connected to different circuits on an integrated circuit chip via selection circuit 1127. In applications in which outputs of only selected inverters are tapped, only selected ones of output lines 1125-1 . . . 1125-(N-1), 1125-N are connected to selection circuit 1127. Alternatively, delayer 1105 can be fabricated with output lines 1125-1 . . . 1125-(N-1), 1125-N formed in place, with only selected ones of the output lines 1125-1 . . . 1125-(N-1), 1125-N, according to the application, connected to selection circuit 1127 for transfer to one or more circuits to provide the representation of the input signal delayed by a selected amount of time to the one or more circuits. The non-selected output lines may remain unconnected to selection circuit 1127. The non-selected output lines may also be connected to selection circuit 1127 with selection circuit 1127 effectively arranged to ignore these non-selected output lines. In another architecture, delayer 1105 can be fabricated with selected ones of output lines 1125-1 . . . 1125-(N-1), 1125-N formed and with only selected ones of the formed selected output lines, according to the application, connected to selection circuit 1127 for transfer to one or more circuits to provide the representation of the input signal delayed by a selected amount of time to the one or more circuits. The non-selected formed output lines may remain unconnected to selection circuit 1127. Alternatively, the non-selected ones of the formed output lines may be connected to selection circuit 1127 with selection circuit 1127 effectively arranged to ignore these non-selected formed output lines.

Selection circuit 1127 provides a mechanism to transfer representation signals $y_1(t) \ldots y_N(t)$ of input $u(t)$ to different circuits on an integrated circuit chip. Selection circuit 1127 can be arranged as a multiplexer to provide $y_1(t) \ldots y_N(t)$ to a set of transfer lines 1129. Selection circuit 1127, arranged as multiplexer, can be fixed during fabrication to transfer specific ones of signals $y_1(t) \ldots y_N(t)$ to specific ones of transfer lines 1129 according to a selected configuration. Selection circuit 1127, arranged as multiplexer, can operate dynamically such that specific ones of signals $y_1(t) \ldots y_N(t)$ can be transferred to specific ones of transfer lines 1129 according to one or more specific signals received by selection circuit 1127. Selection circuit 1127, arranged as multiplexer, can operate dynamically such that specific ones of signals $y_1(t) \ldots y_N(t)$ can be transferred to specific ones of transfer lines 1129 according to an algorithm having instructions stored in a machine-readable storage device. Selection circuit 1127 can be structured as a switch that transfers a selected number of signals $y_1(t) \ldots y_N(t)$ to a selected number of lines of transfer lines 1129. For instance, selection circuit 1127 structured as a switch can transfer a selected one of signals $y_1(t) \ldots y_N(t)$ to one or more of transfer lines 1129. In architectures in which one of the signals $y_1(t) \ldots y_N(t)$ is transferred to a specific circuit, transfer lines 1129 may be formed as a single transfer line. The number of input lines to selection circuit 1127 and the number of transfer lines can depend on the number of output lines 1125-1 ... 1125-N that have been formed and on a given design application.

Figure 12:
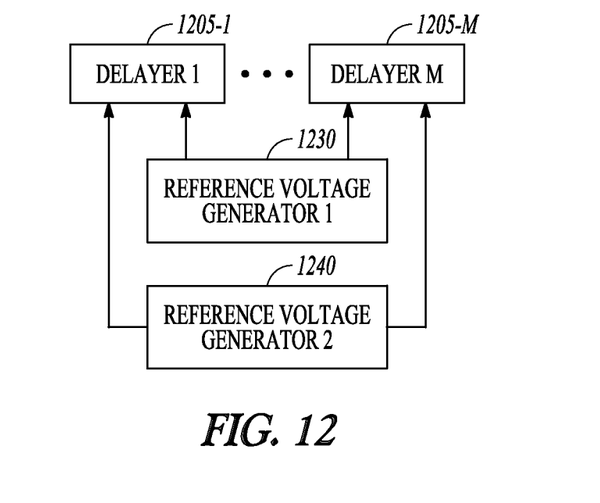
FIG. 12 illustrates example reference voltage generators arranged to provide reference voltages to a number of different delayers, in accordance with various embodiments.

FIG. 12 illustrates an example embodiment of reference voltage generators 1230 and 1240 arranged to provide reference voltages to a number of different delayers 1205-1 ... 1205-M. Reference voltage generators 1230 and 1240 can be structured similar to or identical to the architectures of circuits 630 and 640 illustrated in FIGS. 6A and 6B. The structural characteristics of the transistors, resistors, and current generators can be selected to be coordinated with the design features of delayers 1205-1 ... 1205-M, which may be identical or which may vary from each other. For instance, one or more of delayers 1205-1 ... 1205-M may include a number of inverter stages different from the number of inverter stages of the other ones of delayers 1205-1 ... 1205-M. With respect to one or more ones of delayers 1205-1 ... 11205-M, delayers of the set of delayers 1205-1 ... 1205-M may have a number of outputs to provide one or more signals delayed by the same delay time or different delay times. One or more of delayers 1205-1 ... 1205-M may include a selection circuit, where the selection circuit is arranged as a multiplexer or as a switch.

Reference voltage generators 1230 and 1240 can be structured as a single unit similar to or identical to the architecture of circuits 850 of FIG. 8. The structural characteristics of the transistors, resistors, and current generators of the single unit can be selected to be coordinated with the design features of delayers 1205-1 ... 1205-K ... 1205-M, which may be identical or which may vary, as discussed above.

Figure 13:
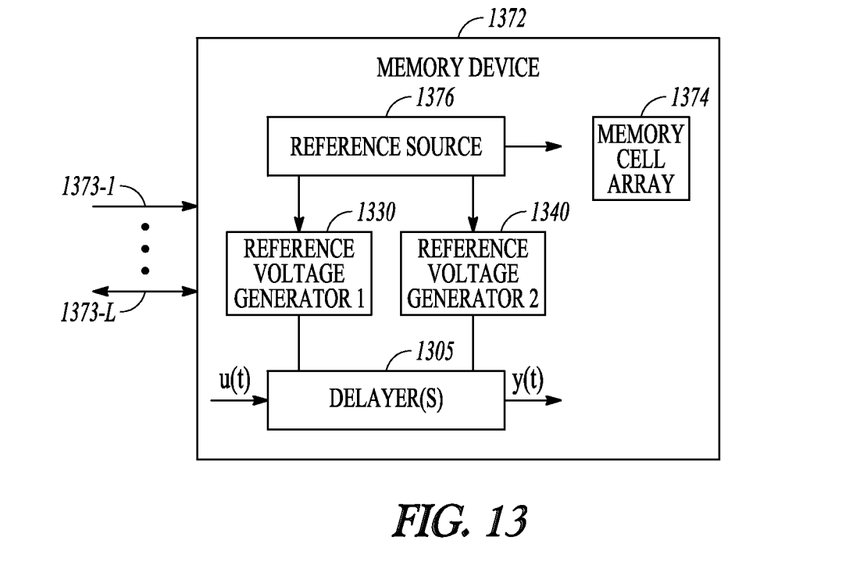
FIG. 13 depicts features of an example memory device having a delayer regulated by reference voltages, in accordance with various embodiments.

FIG. 13 depicts features of an example embodiment of a memory device 1372 having a delayer 1305 regulated by reference voltages. Delayer 1305 can be arranged in memory device 1372 to operate on digital signals to provide these signals with an appropriate delay. Memory device 1372 can include inputs/outputs 1373-1 ... 1373-L to receive data, memory addresses, and command and control signals and to output data and other signals to operate memory device 1372. Inputs/outputs 1373-1 ... 1373-L can include unidirectional inputs and bi-directional inputs depending on the function provided by these inputs and outputs. Inputs/outputs 1373-1 ... 1373-L can include inputs to receive a supply voltage $V_{CC}$ and a system reference voltage $V_{SS}$. System reference voltage $V_{SS}$ can operate at zero volts or a ground potential. In accordance with conventional procedures, memory addresses are used to access memory cells in memory cell array 1374 to store and read data from selected memory cells. To focus on the features of various embodiments discussed herein, without obscuring inventive details, many (if not most) of the components and connections commonly used with a memory device are not shown.

Delayer 1305 can be regulated by reference voltages from reference voltage generators 1330 and 1340. Each of reference voltage generators 1330 and 1340 can include current generators that are provided by reference source 1376 that provides reference signals to components of memory device 1372, where the reference signals are different from supply voltages to memory device 1372. For example, reference source 1376 can be structured as a dedicated circuit that can drive current to a transistor.

Delayer 1305 can be structured in a similar manner or identical to delayers associated with FIG. 5-8 or 10-12. Delayer 1305 can be structured as one or more delayers in memory device 1372 to provide delays to selected signals in an integrated circuit chip in which memory device is disposed. Reference voltage generators 1330 and 1340 can be structured in a similar manner or identical to reference voltage generators associated with FIGS. 6A-B, 8, or 12. In an alternative embodiment, reference voltage generators 1330 and 1340 can be disposed in integrated circuit chip separate from memory device 1372, such as a memory controller, with reference voltages provided to memory device 1372 on input lines of inputs/outputs 1373-1 ... 1373-L that provide $V_{CC}$ and $V_{SS}$.

Figure 14:
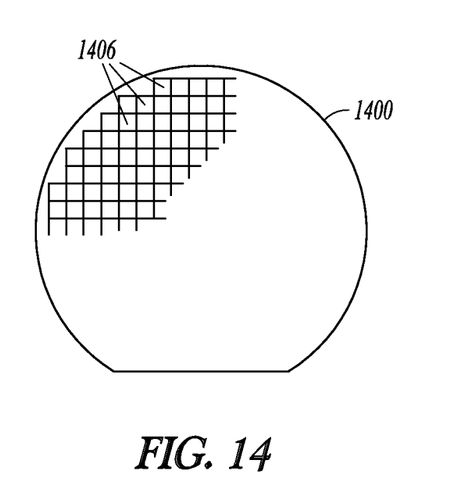
FIG. 14 shows an example wafer, in accordance with various embodiments.

FIG. 14 illustrates an example wafer 1400, in accordance with various embodiments. Wafer 1400 can be provided as a semiconductor wafer or a semiconductor on insulator wafer in which a plurality of dice 1406 can be fabricated to include a delayer structured to be operatively regulated by reference voltages. Alternatively, wafer 1400 can be provided as a wafer in which the plurality of dice 1406 are structures that have been processed to provide electronic functionality including a delayer structured to be operatively regulated by reference voltages and are awaiting singulation from wafer 1400 and packaging. Each die 1406 can be structured to include reference voltage generators that operatively provide the appropriate reference voltages to one or more delayers on die 1406. Reference voltage generators can be formed with current generators. The current generators may comprise constant current generators. The one or more delayers and reference voltage generators can be formed in dice 1406 with structures having architectures similar to or identical to architectures discussed with respect to any of FIGS. 5-8 and 10-13. Wafer 1400 can be fabricated in accordance with conventional procedures. Using various masking and processing techniques, various sets of dice 1406 can be processed to include functional circuitry such that not all of dice 1406 are fabricated as an integrated circuit chip with the same functionality and packaged structure as other dice on wafer 1400. A packaged die having circuits integrated thereon providing electronic capabilities is herein referred to as an integrated circuit (IC).

Figure 15:
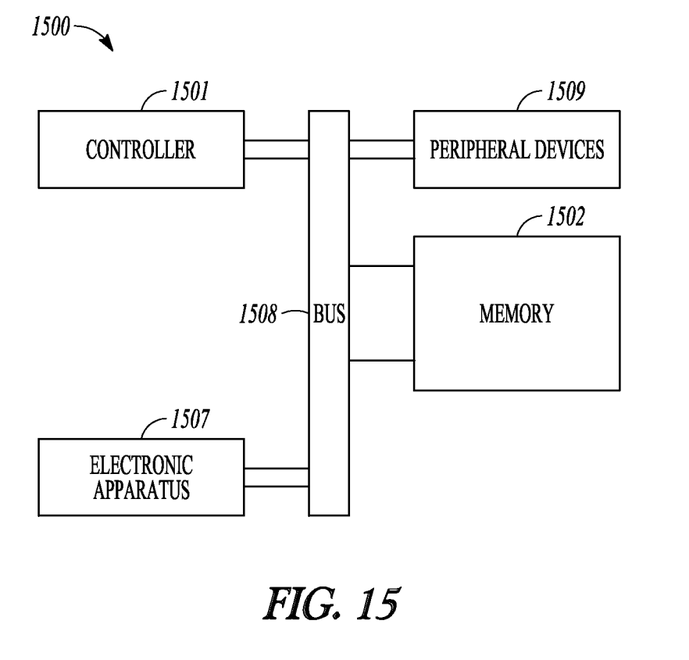
FIG. 15 shows a block diagram of various features of an example electronic system, in accordance with various embodiments.

FIG. 15 shows a block diagram of an example embodiment of system 1500 that includes one or more ICs having one or more delayers structured to be operatively regulated by reference voltages. The ICs can be structured to include reference voltage generators that operatively provide the reference voltages to the delayers. These reference voltage generators can be formed with current generators. The current generators can be constant current generators. In an alternative architecture, the reference voltage generators can be disposed in ICs different from the ICs containing the delayers to which the reference voltage generators provide input. The delay and reference voltage generators can be structured having architectures similar to or identical to architectures discussed with respect to any of FIGS. 5-8 and 10-14, in accordance with various embodiments discussed herein.

System 1500 includes a controller 1501 and a memory 1502. In various embodiments, system 1500 also includes an electronic apparatus 1507 and peripheral devices 1509. One or more of controller 1502, memory 1502, electronic apparatus 1507, and peripheral devices 1509 can be in the form of one or more ICs, any one or more of which may include the delayers and/or reference voltage generators described herein. A bus 1508 provides electrical conductivity between and/or among various components of system 1500. In an embodiment, bus 1508 includes an address bus, a data bus, and a control bus, each independently configured. In an alternative embodiment, bus 1508 uses common conductive lines for providing one or more of address, data, or control, the use of which is regulated by controller 1501. Controller 1501 can be structured in the form or one or more processors.

Electronic apparatus 1507 may include additional memory. Memory in system 1500 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, various forms of dynamic random access memory, or magnetic based memory.

Peripheral devices 1509 may include displays, imaging devices, printing devices, wireless devices, additional storage memory, and control devices that may operate in conjunction with controller 1501. In various embodiments, system 1500 includes, but is not limited to, fiber optic systems or devices, electro-optic systems or devices, optical systems or devices, imaging systems or devices, and information handling systems or devices such as wireless systems or devices, telecommunication systems or devices, and computers.

Figure 16:
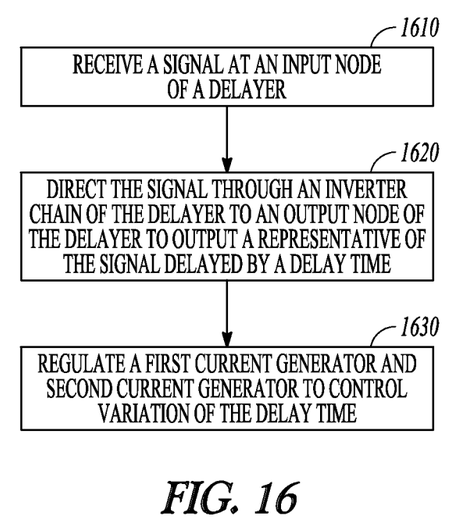
FIG. 16 shows features of an example method that includes delaying an input signal, in accordance with various embodiments.

FIG. 16 shows features of an example embodiment of a method that includes delaying an input signal. At 1620, a signal is received at an input node of a delayer. At 1630, the signal is directed through an inverter chain of the delayer to an output node of the delayer to output a representation of the signal delayed by a delay time, which may be selectable. The inverter chain can include a number of inverters. At 1630, a first current generator and a second current generator are regulated to control variation of the delay time. The first current generator and the second current generator can be operated such that, for a variation of a supply voltage to the delayer, variation of the delay time is less than or equal to a variation amount based on the first current generator and the second current generator. A constant source can be used to provide the first current generator and the second current generator, where the constant source is disposed in an integrated circuit chip to which the representation of the signal delayed by the delay time is transmitted from the output node.

Operating the delayer can include tapping an output of one or more of the inverters in the inverter chain to provide the representation of the signal to one or more output nodes. Tapping the output of one of the inverters can include using a switch to select the output of the one inverter. Operating the delayer can include operating the delayer on the signal received at the input node, where the signal is a digital signal having frequency less than or equal to about 5 GHz. A delayer can be operated in accordance with operating an inverter chain having stages regulated by reference voltages established by current generators in a manner similar or identical to delayer architectures as taught herein.

In various embodiments, a circuit arranged as a delayer can be structured to delay a high frequency digital signal by an interval time quite independent from the supply voltage. In one example, the performance of the delayer can be measured as a 5% spread in the delay time for a spread of supply voltage of 28%. Other delayers may be constructed with more or less than about a 5% spread in the delay time for a spread in the supply voltage of about 25% to about 30%. Further, spread in the delay time can be reduced to selected limits for an application by applying appropriate mirroring factors between voltage reference generators and the inverter modules that provide delay to a signal.

The chain of inverter modules that compose the body of the delayer can be equipped with more than one output such that the effective delay to be realized can be selected by algorithm, by configuration, by a specified signal, or by some other selection mechanism. In addition, voltage reference generators that generate reference voltages to a delayer can be shared by a plurality of delayers. The plurality of delayers may be disposed in an integrated circuit chip that provides different delays to different signals in functional circuits of the integrated circuit chip. With reference signals, such as REF_P and REF_N as discussed herein, distributed throughout the integrated circuit chip, these reference lines can be protected from being disturbed. The protection to these reference lines can be provided by standard shielding mechanisms.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A delay apparatus comprising:
an input node configured to receive a signal;
an output node configured to output a representation of the signal delayed by a delay time;
an inverter chain coupled between the input node and the output node and comprising a plurality of inverters wherein each inverter is configured to generate a respective delay in response to a first reference voltage and a second reference voltage such that the delay time is equal to a sum of each respective delay;
a first reference voltage generator configured to generate the first reference voltage, the first reference voltage generator comprising:
a first current generator configured to generate a first current;
a first transistor coupled to the first current generator, the first transistor comprising a collector node coupled to a supply voltage, $V_{CC}$, and a drain node coupled to the first current generator; and
a first resistance coupled between the supply voltage, $V_{CC}$, and the drain node, wherein the drain node provides the first reference voltage; and
a second reference voltage generator configured to generate the second reference voltage.

2. The apparatus of claim 1, wherein the second reference voltage generator comprises:
a second current generator configured to generate a second current;
a second transistor coupled to the second current generator, the second transistor comprising a source node coupled to a supply voltage, $V_{SS}$, and a drain node coupled to the second current generator; and
a second resistance coupled between the supply voltage, $V_{SS}$, and the drain node, wherein the drain node provides the second reference voltage.

3. The apparatus of claim 2, wherein a resistance value of the first resistance is approximately equal to a resistance value of the second resistance.

4. The apparatus of claim 2, wherein one of the first or second transistors is an n-channel transistor and the other transistor is a p-channel transistor.

5. The apparatus of claim 1, further comprising a selection circuit coupled between outputs of the plurality of inverters and the output node, the selection circuit configured to place a selected signal from any one of the plurality of inverters at the output node.

6. The apparatus of claim 5, wherein the selection circuit is configured to select a first inverter output to generate an inverted, delayed representation of the signal and a second inverter output to generate a delayed representation of the signal.

7. The apparatus of claim 5, wherein the selection circuit is coupled between the output node and only even numbered positions in the inverter chain.

8. The apparatus of claim 5, wherein the selection circuit is coupled between the output node and only odd numbered positions in the inverter chain.

9. The apparatus of claim 5, wherein the selection circuit is configured to dynamically transfer one of the outputs of the plurality of inverters to specific ones of a plurality of output nodes.

10. A memory device comprising:
memory circuits; and
a delayer configured to generate a delayed signal for the memory circuits, the delayer comprising:
an inverter chain coupled between an input node, configured to receive a signal, and an output node, configured to output the delayed signal, and comprising a plurality of inverters wherein each inverter is configured to generate a respective delay in response to a first reference current and a second reference current;
a first circuit configured to generate the first reference current; and
a second circuit configured to generate the second reference current, the second circuit comprising:
a current generator configured to generate the second reference current;
a transistor coupled to the current generator, the transistor comprising a source node coupled to a supply voltage, $V_{SS}$, and a drain node coupled to the current generator; and
a resistance coupled between the supply voltage, $V_{SS}$, and the drain node, wherein the drain node sources the second reference current.

11. The memory device of claim 10, wherein the memory circuits comprise a memory array.

12. The memory device of claim 11, wherein at least one inverter stage has an output tap to output a respective representation of the digital signal from the delayer delayed by an amount dependent on position of the respective inverter stage in the inverter chain.

13. The memory device of claim 12, wherein the delayer includes a switch to select one of the output taps to provide the representation of the digital signal at the output node of the delayer.

14. A system comprising:
a controller; and
a memory device coupled to the controller, the memory device having a delay circuit comprising:
an inverter chain configured to generate a delay time, the inverter chain coupled between an input node and an output node and comprising a plurality of inverters wherein each inverter is configured to generate a respective delay in response to a first reference voltage and a second reference voltage such that the delay time is equal to a sum of each respective delay wherein the delay circuit further includes a first circuit having a first current generator coupled to a reference supply voltage node, the first current generator coupled to the supply voltage node by a first resistor in parallel with a first transistor to generate the first reference voltage.

15. The system of claim 14, wherein the delay circuit includes a second circuit having a second current generator coupled to a supply voltage node, the second current generator coupled to the supply voltage node by a second resistor in parallel with a second transistor to generate the second reference voltage.

* * * * *